US011838725B2

(12) United States Patent
Shi et al.

(10) Patent No.: US 11,838,725 B2
(45) Date of Patent: Dec. 5, 2023

(54) MEMS MICROPHONE

(71) Applicant: AAC ACOUSTIC TECHNOLOGIES (SHENZHEN) CO., LTD., Shenzhen (CN)

(72) Inventors: Zhengyu Shi, Shenzhen (CN); Zhuanzhuan Zhao, Shenzhen (CN); Rui Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 106 days.

(21) Appl. No.: 17/566,700

(22) Filed: Dec. 31, 2021

(65) Prior Publication Data

US 2023/0171550 A1    Jun. 1, 2023

(30) Foreign Application Priority Data

Nov. 26, 2021    (CN) .......................... 202122956535.4

(51) Int. Cl.
*H04R 19/04*    (2006.01)
*H04R 7/04*    (2006.01)
*H04R 7/18*    (2006.01)
*B81B 3/00*    (2006.01)

(52) U.S. Cl.
CPC ........... *H04R 19/04* (2013.01); *B81B 3/0072* (2013.01); *H04R 7/04* (2013.01); *H04R 7/18* (2013.01); *B81B 2201/0257* (2013.01); *B81B 2203/0127* (2013.01); *B81B 2203/0315* (2013.01); *H04R 2201/003* (2013.01)

(58) Field of Classification Search
CPC . H04R 19/04; H04R 7/04; H04R 7/18; H04R 2201/003
See application file for complete search history.

(56) References Cited

U.S. PATENT DOCUMENTS

2019/0116427 A1*    4/2019    Inoue .................... B81B 3/0072

* cited by examiner

*Primary Examiner* — Sunita Joshi

(74) *Attorney, Agent, or Firm* — W&G Law Group

(57) ABSTRACT

The present disclosure discloses a MEMS microphone including a substrate with a back cavity, and an electric capacitance system arranged on the substrate. The electric capacitance system includes a back plate and a diaphragm opposite to the back plate. The back plate includes a body part, a fixing portion connected to the substrate, and a connecting portion connecting the body part and the fixing portion. The diaphragm is fixed to the substrate and located at a side of the back plate close to the substrate. The fixing portion includes a first surface away from the substrate, the first surface includes a first arc surface connected with the body part, the first arc surface protrudes toward a direction away from the substrate. Compared with the related art, MEMS microphone disclosed by the present disclosure has a better reliability.

8 Claims, 3 Drawing Sheets

MEMS MICROPHONE

FIELD OF THE PRESENT DISCLOSURE

The present disclosure relates to microphones, in particular to a micro-electro-mechanical system (MEMS) microphone.

DESCRIPTION OF RELATED ART

In recent years, mobile communication technology has been rapidly developed. Consumers are increasingly using mobile communication devices, such as portable phones, portable phones with Internet access, personal digital assistants, or other devices for communication on a dedicated communication network. The microphone is one of the important components, especially the MEMS microphone.

Micro-Electro-Mechanical System (MEMS) microphone is a kind of electrical energy sound exchanger made by micro-machining technology, which has the characteristics of small size, good frequency response characteristics, and low noise. With the development of smaller, lighter and thinner electronic devices, MEMS microphones are more and more widely used in these devices.

A MEMS microphone in the related art includes a substrate with a back cavity and an electric capacitance system arranged on the substrate. The electric capacitance system includes a back plate and a diaphragm opposite to the back plate. The back plate includes a body part, a fixing portion arranged on the substrate and a connecting portion connecting to the body part and the fixing portion. The connecting portion is perpendicular to the body part and the fixing portion, the back plate and the substrate are connected in a manner of right-angle. When the MEMS microphone is subjected to high sound pressure, stress concentration exists at the right-angle connection, which makes the back plate easy to break and reduces the reliability of the back plate.

Thus, it is necessary to provide a novel MEMS microphone to solve the problem.

SUMMARY OF THE DISCLOSURE

A MEMS microphone disclosed in the present disclosure including a substrate with a back cavity, and an electric capacitance system arranged on the substrate. The electric capacitance system includes a back plate and a diaphragm opposite to the back plate. The back plate includes a body part, a fixing portion connected to the substrate, and a connecting portion connecting the body part and the fixing portion. The diaphragm is fixed to the substrate and located at a side of the back plate close to the substrate. The fixing portion includes a first surface away from the substrate, the first surface includes a first arc surface connected with the body part, the first arc surface protrudes toward a direction away from the substrate.

Further, the fixing portion includes a second surface opposite to the first surface, the second surface comprises a second arc surface extending to the substrate.

Further, the fixing portion includes a second surface opposite to the first surface, the second surface comprises a second arc surface connected to the connecting portion and a connecting surface connecting the second arc surface and the substrate, the connecting surface is perpendicular to the substrate.

Further, the fixing portion includes a second surface opposite to the first surface, the second surface comprises a second arc surface connected to the connecting portion and a connecting surface connecting the second arc surface and the substrate, the connecting surface is a circular arc surface.

Further, the first surface includes a third arc surface connected to the first arc surface and the fixing portion, the third arc surface protrudes toward the direction away from the substrate.

Further, a junction of the first arc surface and the third arc surface is closer to the substrate than the body part.

Further, the third arc surface is a circular arc surface.

Further, the first arc surface is a circular arc surface.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to exemplary embodiments. To make the technical problems to be solved, and technical solutions and beneficial effects of the present disclosure more apparent, the present disclosure is described in further detail together with the figure and the embodiment. It should be understood the specific embodiment described hereby is only to explain the disclosure, not intended to limit the disclosure.

First Embodiment

Figure 1:
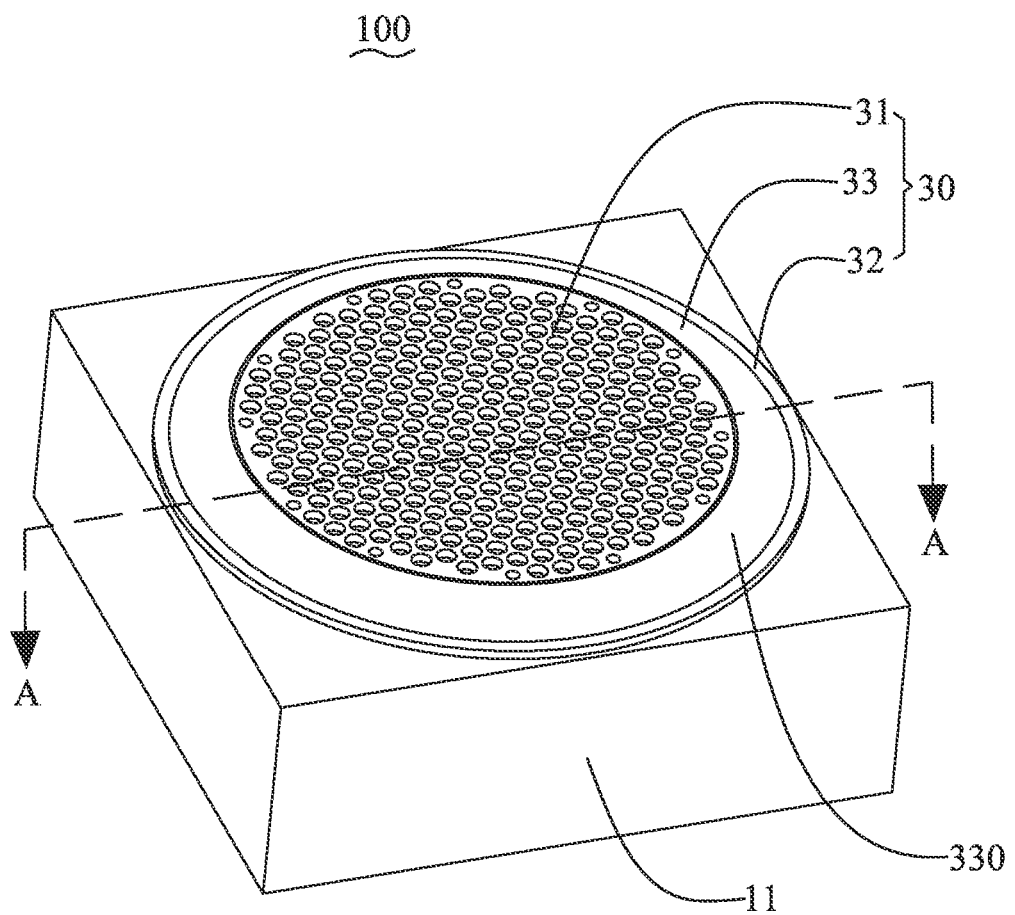
FIG. 1 is a perspective structural schematic view of the MEMS microphone provided in a first embodiment.
Figure 2:
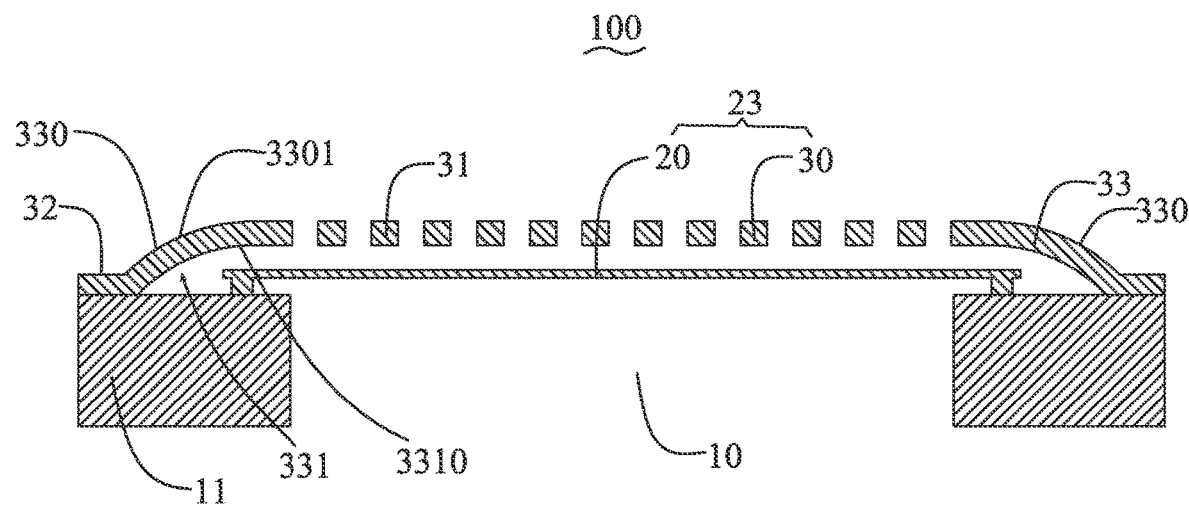
FIG. 2 is a cross-sectional view taken along a line A-A of FIG. 1.

Referring to FIG. 1, this embodiment provides a MEMS microphone 100, including a substrate 11 with a back cavity 10 and an electric capacitance system 23 arranged on the substrate 11. The electric capacitance system 23 includes a back plate 30 and a diaphragm 20 opposite to the back plate 30, the back plate 30 and the diaphragm 20 are fixed to the substrate 11, the diaphragm 20 is located at a side of the back plate 30 close to the substrate 11.

The back plate 30 includes a body part 31, a fixing portion 32 connected to the substrate 11, and a connecting portion 33 connecting the body part 31 and the fixing portion 32. The fixing portion 32 further includes a first surface 330 away from the substrate 11 and a second surface 331 opposite to the first surface 330. The first surface 330 includes a first arc surface 3301 connected to the body part 31, the first arc surface 3301 protrudes toward a direction away from the substrate 11. As the first arc surface 3301 is connected to the body part 31, the stress distribution at a connection position of the back plate 30 and the base 11 can be improved, and the reliability of the back plate 30 can be improved.

In addition, the second surface 331 includes a second arc surface 3310 extending to the substrate 11. In other words, the second arc surface 3310 directly connects to the substrate 11 which can further improve the stress distribution at the connection position of the back plate 30 and the base 11. The first arc surface 3301 and the second arc surface 3310 are both circular arc surfaces.

Second Embodiment

Figure 3:
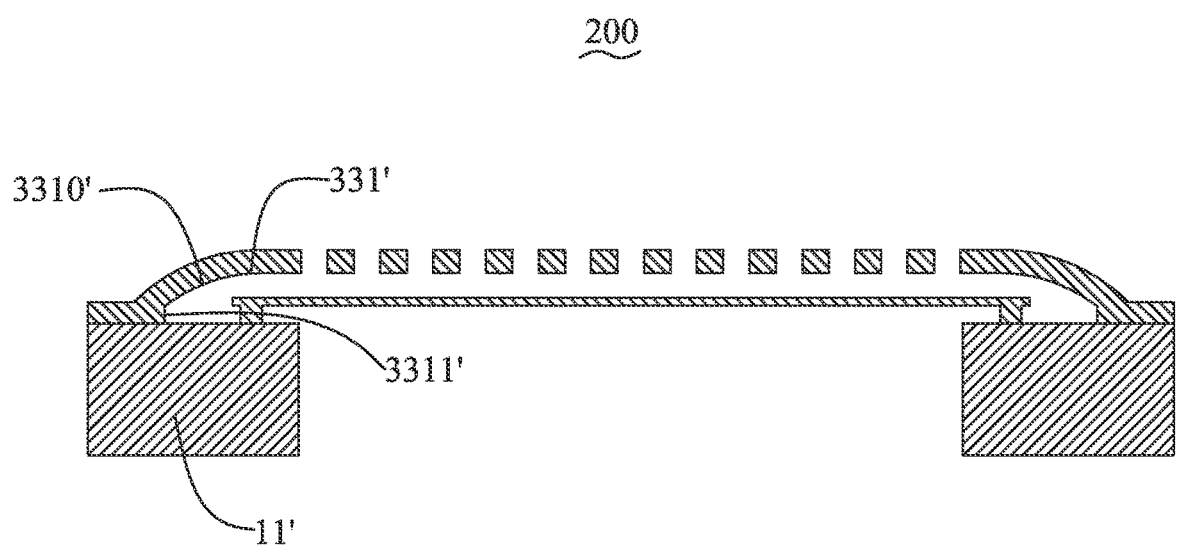
FIG. 3 is a cross-sectional view of the MEMS microphone provided in a second embodiment.

Referring to FIG. 3, a MEMS microphone 200 is provided by the second embodiment The distinction between the second embodiment and the first embodiment is that: a second surface 331' further includes a connecting surface 3311' connecting a second arc surface 3310' and a substrate 11', the connecting surface 3311' is perpendicular to the substrate 11'.

Third Embodiment

Figure 4:
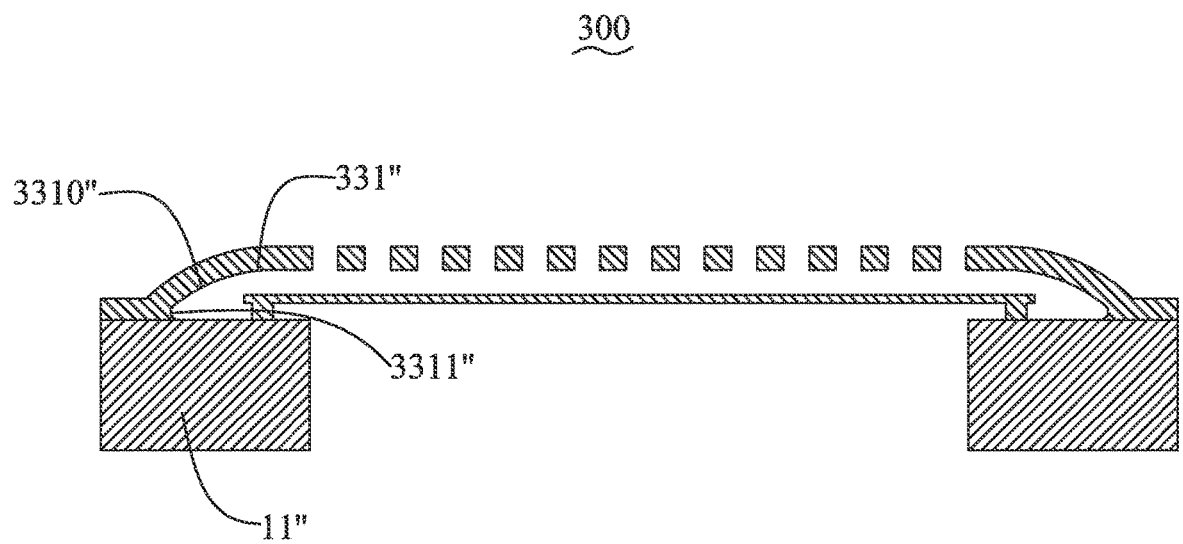
FIG. 4 is a cross-sectional view of the MEMS microphone provided in a third embodiment.

Referring to FIG. 4, a MEMS microphone 300 is provided by the third embodiment of the present disclosure. The distinction between the third embodiment and the first embodiment is that a second surface 331" further includes a connecting surface 3311" connecting a second arc surface 3310" and a substrate 11", the connecting surface 3311" is a circular arc surface.

Fourth Embodiment

Figure 5:
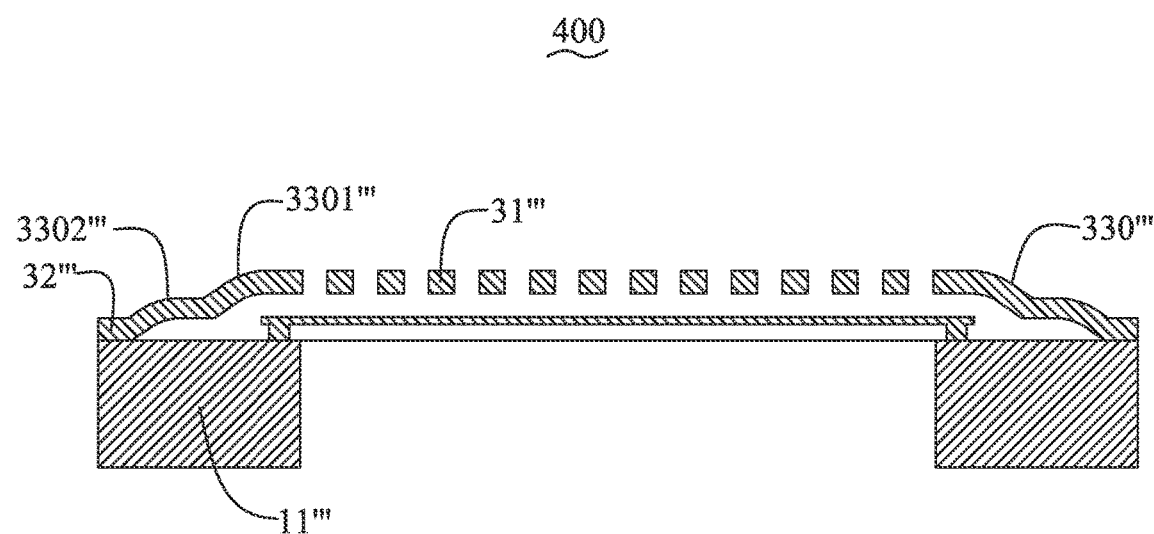
FIG. 5 is a cross-sectional view of the MEMS microphone provided in a fourth embodiment.

Referring to FIG. 5, a MEMS microphone is provided by the fourth embodiment of the present disclosure. The distinction between the fourth embodiment and the first embodiment is that the first surface 330''' further includes a third arc surface 3302''' connecting a first arc surface 3301''' and a fixing portion 32", the third arc surface 3302''' protrudes toward the direction away from the substrate 11'''. A junction of the first arc surface 3301''' and the third arc surface 3302''' is closer to the substrate 11''' than a body part 31'''. In other embodiments, the first surface 330''' could further include more arc surfaces connected to each other, the third arc surface could also be an circular arc surface.

It is to be understood, however, that even though numerous characteristics and advantages of the present exemplary embodiment have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms where the appended claims are expressed.

What is claimed is:

1. A MEMS microphone, comprising:
a substrate with a back cavity; and
an electric capacitance system arranged on the substrate, comprising:
a back plate, including a body part, a fixing portion connected to the substrate, and a connecting portion connecting the body part and the fixing portion; and
a diaphragm opposite to the back plate, fixed to the substrate and located at a side of the back plate close to the substrate; wherein
the fixing portion includes a first surface away from the substrate and a second surface opposite to the first surface, the first surface includes a first arc surface connected with the body part, the first arc surface protrudes toward a direction away from the substrate, the second surface comprises a second arc surface connected to the connecting portion and a connecting surface connecting the second arc surface and the substrate, the connecting surface is perpendicular to the substrate.

2. The MEMS microphone as described in claim 1, wherein the first arc surface is a circular arc surface.

3. A MEMS microphone, comprising:
a substrate with a back cavity; and
an electric capacitance system arranged on the substrate, comprising:
a back plate, including a body part, a fixing portion connected to the substrate, and a connecting portion connecting the body part and the fixing portion; and
a diaphragm opposite to the back plate, fixed to the substrate and located at a side of the back plate close to the substrate; wherein
the fixing portion includes a first surface away from the substrate and a second surface opposite to the first surface, the first surface includes a first arc surface connected with the body part, the first arc surface protrudes toward a direction away from the substrate, the second surface comprises a second arc surface connected to the connecting portion and a connecting surface connecting the second arc surface and the substrate, the connecting surface is a circular arc surface.

4. The MEMS microphone as described in claim 3, wherein the first arc surface is a circular arc surface.

5. A MEMS microphone, comprising:
a substrate with a back cavity; and
an electric capacitance system arranged on the substrate, comprising:
a back plate, including a body part, a fixing portion connected to the substrate, and a connecting portion connecting the body part and the fixing portion; and
a diaphragm opposite to the back plate, fixed to the substrate and located at a side of the back plate close to the substrate; wherein
the fixing portion includes a first surface away from the substrate, the first surface includes a first arc surface connected with the body part and a third arc surface connected to the first arc surface and the fixing portion, the first arc surface protrudes toward a direction away from the substrate, the third arc surface protrudes toward the direction away from the substrate.

6. The MEMS microphone as described in claim 5, wherein a junction of the first arc surface and the third arc surface is closer to the substrate than the body part.

7. The MEMS microphone as described in claim 5, wherein the third arc surface is a circular arc surface.

8. The MEMS microphone as described in claim 5, wherein the first arc surface is a circular arc surface.

* * * * *